United States Patent
Ma et al.

(10) Patent No.: US 9,735,013 B2
(45) Date of Patent: Aug. 15, 2017

(54) ION IMPLANTATION FOR IMPROVED CONTACT HOLE CRITICAL DIMENSION UNIFORMITY

(71) Applicant: Varian Semiconductor Equipment Associates, Inc., Gloucester, MA (US)

(72) Inventors: Tristan Y. Ma, Lexington, MA (US); John Hautala, Beverly, MA (US); Maureen K. Petterson, Salem, MA (US); Boya Cui, Evanston, IL (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/970,699

(22) Filed: Dec. 16, 2015

(65) Prior Publication Data
US 2017/0178911 A1    Jun. 22, 2017

(51) Int. Cl.
| | |
|---|---|
| *H01L 21/00* | (2006.01) |
| *H01L 21/265* | (2006.01) |
| *H01L 21/027* | (2006.01) |
| *H01L 21/308* | (2006.01) |
| *H01L 21/66* | (2006.01) |
| *H01L 21/768* | (2006.01) |

(52) U.S. Cl.
CPC .... *H01L 21/26586* (2013.01); *H01L 21/0276* (2013.01); *H01L 21/308* (2013.01); *H01L 21/76816* (2013.01); *H01L 22/20* (2013.01)

(58) Field of Classification Search
CPC .......... H01L 21/26586; H01L 21/266; H01L 21/0332; H01L 21/0334; H01L 21/0335
See application file for complete search history.

(56) References Cited

U.S. PATENT DOCUMENTS

| | | | | |
|---|---|---|---|---|
| 7,786,017 | B1 * | 8/2010 | Morgenfeld | ...... H01L 21/31116 |
| | | | | 257/E21.246 |
| 9,520,290 | B1 * | 12/2016 | Ma | ...... H01L 21/0276 |
| 2006/0051965 | A1 * | 3/2006 | Edelberg | ............ G03F 7/40 |
| | | | | 438/706 |
| 2011/0147985 | A1 * | 6/2011 | Cheng | .......... G03F 7/0392 |
| | | | | 264/225 |
| 2014/0242523 | A1 * | 8/2014 | Godet | ............ G03F 7/091 |
| | | | | 430/323 |

FOREIGN PATENT DOCUMENTS

CN        102096310 A   *   6/2011

OTHER PUBLICATIONS

Machine translation of CN102096310.*

* cited by examiner

*Primary Examiner* — Zandra Smith
*Assistant Examiner* — John M Parker

(57) ABSTRACT

Provided herein are approaches for patterning a semiconductor device. In an exemplary approach, a method includes providing a set of contact openings through a photoresist formed atop a substrate, and implanting ions into just a sidewall surface of the set of contact openings. In an exemplary approach, the ions are implanted at an implant angle nonparallel with the sidewall surface to prevent the ions from implanting a surface of the substrate within the set of contact openings, and to form a treated layer along an entire height of the contact opening. The method further includes etching the substrate within the set of contact openings after the ions are implanted into the sidewall surface. As a result, by using an angled ion implantation to the contact opening sidewall surface as a pretreatment prior to etching, local critical dimension uniformity is improved.

18 Claims, 5 Drawing Sheets

ION IMPLANTATION FOR IMPROVED CONTACT HOLE CRITICAL DIMENSION UNIFORMITY

FIELD OF THE DISCLOSURE

The present embodiments relate to substrate patterning, and more particularly, to techniques for implanting contact holes with ions.

BACKGROUND OF THE DISCLOSURE

Integrated circuits are often formed on a semiconductor substrate, such as a silicon wafer or other semiconductive material. In general, various materials such as semiconductive, conductive, or electrically insulative materials, are used to form integrated circuits. By way of example, the various materials may be doped, ion implanted, deposited, etched, grown, etc., using various processes. A continuing goal in semiconductor processing is to reduce the size of individual electronic components, thus enabling smaller and denser integrated circuitry.

One technique for patterning and processing semiconductor substrates is photolithography. Such technique includes deposition of a patternable masking layer commonly known as photoresist. These materials can be processed to modify their solubility in certain solvents, and are therefore readily used to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, to leave a masking pattern of the photoresist on the substrate. Adjacent areas of the underlying substrate next to the masked portions can be processed, for example by etching or ion implanting, to effect the intended processing of the substrate adjacent the masking material. In certain instances, multiple different layers of photoresist and/or a combination of photoresists with non-radiation sensitive masking materials are used. Further, patterns may be formed on substrates without using photoresist.

The continual reduction in feature sizes places ever greater demands on the techniques used to form the features. As such, a need has arisen to more accurately define and control the dimensions and shapes of photoresist (resist) features used to pattern substrates. Various techniques have been developed to treat photoresist features after the photoresist features are formed, yet before the photoresist features are used to pattern a substrate. The treatment may be used, for example, to control the shape and roughness for photoresist features. Etch has been known to improve line edge roughness (LER) or line width roughness (LWR) during the patterning process, yet there exists a limit to how much etch can improve contact edge roughness (CER).

Furthermore, local critical dimension uniformity (LCDU) of contact holes becomes influential with continued scaling, resulting in variations in device performance and contributing to the total edge placement errors. LCDU of contact holes is generally influenced by a number of factors, including, yet not limited to: resist residue on feature sidewalls due to uneven acid concentration within the resist, an effect collectively known as "shot noise," and irregularities during the development process; non-straight sidewalls and/or excessive footing at the bottom of the resist; and significant CER as a result of the shot noise.

SUMMARY OF THE DISCLOSURE

In view of the foregoing, approaches herein provide an angled ion implantation to impact the contact holes, thus reducing CER and improving LCDU. In an exemplary approach, the angle of incident ions is selected so the entire sidewall of a contact hole with a lithography target critical dimension (CD) will be exposed to ions, yet the bottom of the contact hole will be shadowed by an opposing sidewall of a patterning feature. Thus, fragmentation and densification within the photoresist occurs, facilitating resist reflow and improved CER.

An exemplary approach in accordance with the present disclosure may include forming a semiconductor device by providing a set of contact openings through a photoresist formed atop a substrate, and implanting ions into just a sidewall surface of the set of contact openings. The ions may be implanted at an implant angle nonparallel with the sidewall surface to implant ions along an entire height of the sidewall surface and to prevent the ions from implanting a surface of the substrate within the set of contact openings. The approach may further include etching the substrate within the set of contact openings after the ions are implanted into the sidewall surface.

Another exemplary approach in accordance with the present disclosure may include forming a semiconductor device by providing a set of contact openings through a photoresist formed atop a substrate, and implanting ions into just a sidewall surface defined by each of the set of contact openings. The ions may be implanted at an implant angle nonparallel with the sidewall surface selected to prevent the ions from implanting a surface of the substrate within the set of contact openings and to form a treated layer along an entire height of the sidewall surface. The approach may further include etching the surface of the substrate within the set of contact openings after the ions are implanted into the sidewall surface.

Yet another exemplary approach in accordance with the present disclosure may include patterning a semiconductor device by providing a set of patterning features atop a substrate, the set of patterning features defining a set of contact openings formed through a photoresist, and performing a series of ion implants to a sidewall surface of the set of photoresist patterning features. The ions may be implanted at an implant angle nonparallel with the sidewall surface to prevent the ions from implanting a surface of the substrate between the set of patterning features and to form a treated layer along an entire height of the sidewall surface. The approach may further include etching the substrate to recess the set of contact openings into a first layer of the substrate.

Figure 1:
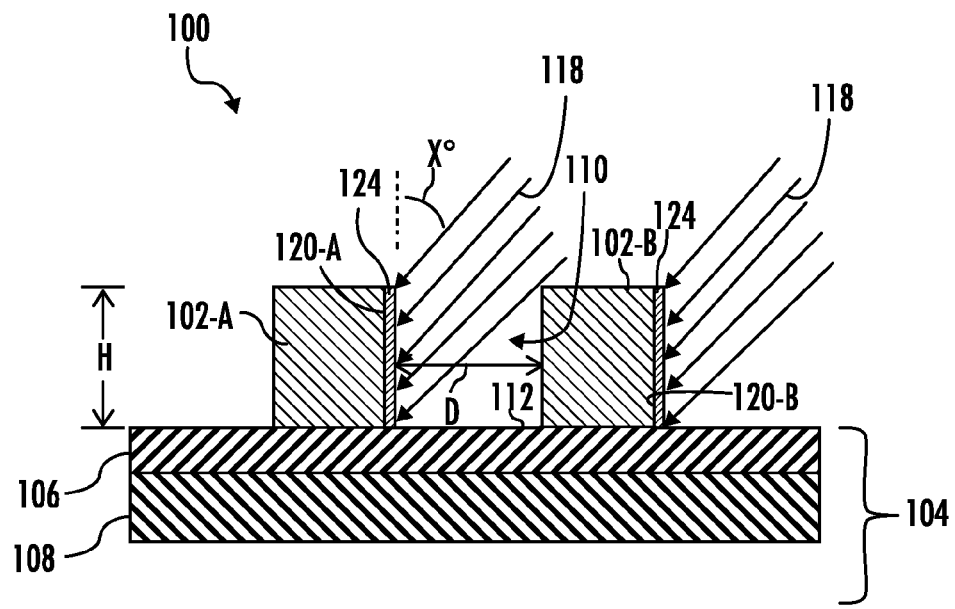
FIG. 1 depicts a side cross-sectional view of an approach for performing an ion implant to a set of patterning features of a semiconductor device in accordance with an embodiment of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where embodiments of the methods are shown. The method may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

As further described herein, provided herein are approaches for patterning a semiconductor device. More specifically, the embodiments described herein provide techniques for processing a patterning feature such as a photoresist feature using multiple exposures of energetic species including ions, electrons, and vacuum UV radiation. The term "patterning feature" as used herein, refers to features such as photoresist, patterned organic or inorganic underlayers including anti-reflective coatings (ARC), bottom anti-reflective coatings (BARC), or other features used to transfer a pattern into one or more layers of a substrate. Various embodiments provide one or more advantages over known techniques used to process photoresists. For example, when ion implantation is used to treat a photoresist feature, line edge roughness (LER) or line width roughness (LWR) may be improved in some instances. LER and LWR as used herein refers to variation along an edge of a photoresist line or in line width of a photoresist feature, for example, along a length of the photoresist feature as viewed in a plan view. Furthermore, CER is also improved as a result of the angled ion implant to the photoresist patterning feature. CER as used herein refers to variation of the local radii of a single contact hole. The roughness types, e.g., CER, LER, and LWR, are defined as the deviations of the edge points from a smooth reference line. In LER/LWR, the reference is a straight line, whereas in CER the reference is a circle or an ellipse.

The embodiments of the present disclosure provide advantages including the ability to tailor the photoresist profile by directing an angled exposure to a photoresist feature, wherein the exposure may constitute implantation of ions or exposure to high energy electromagnetic radiation, for example. The angled exposure may result in improved photoresist profiles, and may additionally improve CER. The present embodiments may also provide improved etch selectivity with respect to an underlying layer disposed under a photoresist layer or photoresist feature, as well as improved photoresist profiles with respect to known post-lithography treatment of photoresists.

More specifically, the embodiments of the present disclosure apply an angled ion implantation to treat a sidewall surface of a contact opening, thus improving LCDU. For example, LCDU may result from contact holes of varying dimensions. Since photoresist thickness across the wafer is generally uniform, the CD non-uniformity results in varying aspect ratios. Specifically, for smaller diameter contact openings, the higher aspect ratio limits how deep the ions can reach, resulting in a portion of the lower sidewall remaining unexposed to ions. At the other extreme, larger diameter contact holes with smaller aspect ratio allow ions to reach not just the entire sidewall surface, yet also the layer between the contact features near the outer edge of the contact holes.

Embodiments herein allow the angle of incident ions to be applied in such a way to allow the entire sidewall of a contact hole with a lithography target CD to be exposed to ions. Meanwhile, the substrate exposed at the bottom of the contact opening is completely shadowed by the opposing patterning feature sidewall and, therefore, is untreated by the ion implant. A hardened, treated layer is thus formed along an entire sidewall dimension (e.g., vertical height) of the patterning feature defined by the contact hole as a result of the angled ion implant.

Hardening of the photoresist along an entire sidewall of the contact opening improves LCDU. For example, in the case of a smaller diameter contact hole, wherein the lower portion is not implanted, a portion of the photoresist remains unprotected and thus much less resistant to the chemistry of a subsequent etch process. Since the selectivity between the photoresist and underlayers is usually poor, the CD at the bottom will increase more during etching due to lateral erosion, thus leading to slightly larger recesses in the substrate. Meanwhile, for the larger diameter contact openings, a portion of the substrate between the patterning features of the photoresist is implanted, essentially forming a ring of hardened material at a base of the contact opening, and reducing the effective contact hole CD. This results in slightly smaller recesses in the substrate after a subsequent etch process. Embodiments herein provide approaches for evening out the differences in CD, thus leading to improvement in LCDU.

Furthermore, embodiments herein may be especially advantageous for treating photoresist features having a critical dimension (CD) of 100 nm or less. In such photoresist features, CER may cause large and undesirable variations in CD within features within a substrate after etching of the substrate when the photoresist feature is in place. Although conventional ion implantation directed perpendicular to a substrate may somewhat improve CER, the cross-sectional profiles of the implanted photoresist end may be degraded some amount depending on species, dose, and energy incident on the photoresist feature, generating an undesirable profile to the photoresist feature. This may result in less than ideal etch behavior.

Turning now to FIG. 1 there is shown a cross-sectional view of an approach for patterning a device 100 according to various embodiments of the disclosure. In FIG. 1, a set of (i.e., one or more) patterning features 102-A and 102-B is disposed upon a substrate 104. In various embodiments, the substrate 104 may include multiple layers including a layer 106 such as an antireflection coating (ARC) or a bottom antireflective coating (BARC), and a second layer 108 such as spin-on carbon (SOC). The set of patterning features 102A-B may be formed from a photoresist. Furthermore, the set of patterning features 102A-B define a set of contact openings 110 formed through the photoresist, as shown.

In various embodiments, the set of patterning features 102 may form part of a larger pattern of features disposed on a silicon wafer or other substrate. Accordingly, the set of patterning features 102 may be characteristic of many other similar features disposed on the substrate 104, such as millions of other similar features. In order to transfer an intended shape and size of a feature to the substrate 104 by etching the substrate 104, the CER of the set of contact openings 110 may be improved, and an acceptable sidewall profile before etching may be maintained.

In this embodiment, the set of patterning features 102A-B may have a uniform height 'H' across the wafer, as well as a uniform distance 'D' between adjacent patterning features. Because the geometries of the set of patterning features 102A-B are generally constant across the wafer, the set of patterning features 102A-B may be used to shadow the space between the lines. In one embodiment, the ion incidence implant angle X for an ion implantation 118 may be chosen in such a way so just the sidewall surfaces 120A-B of the patterning features 102A-B are implanted. Meanwhile, the area of the layer 106 between the set of patterning features 102A-B is not affected. As such, when using certain species such as Si for the ion implantation 118, the selectivity of the photoresist of the set of patterning features 102A-B to the layer 106 (e.g., ARC) can be significantly improved, while beneficially improving CER.

As further shown in FIG. 1, the ion implantation 118 to respective sidewall surfaces 120A-B of the set of patterning features 102A-B forms a treated layer 124 along the set of patterning features 102A-B. In exemplary embodiments, the ion implantation 118 is performed at an implant angle 'X°' nonparallel with the sidewall surfaces 120A-B. In one embodiment, the ion implantation 118 imparts ions at approximately 30° incidence angle to the sidewall surfaces 120A-B (or approximately 60° relative to a plane normal to the sidewall surface 120) to form the treated layer 124 along an entire height 'H' of the sidewall surfaces 120A-B. The implantation angle may vary in other embodiments by +/−15°.

Figure 2:
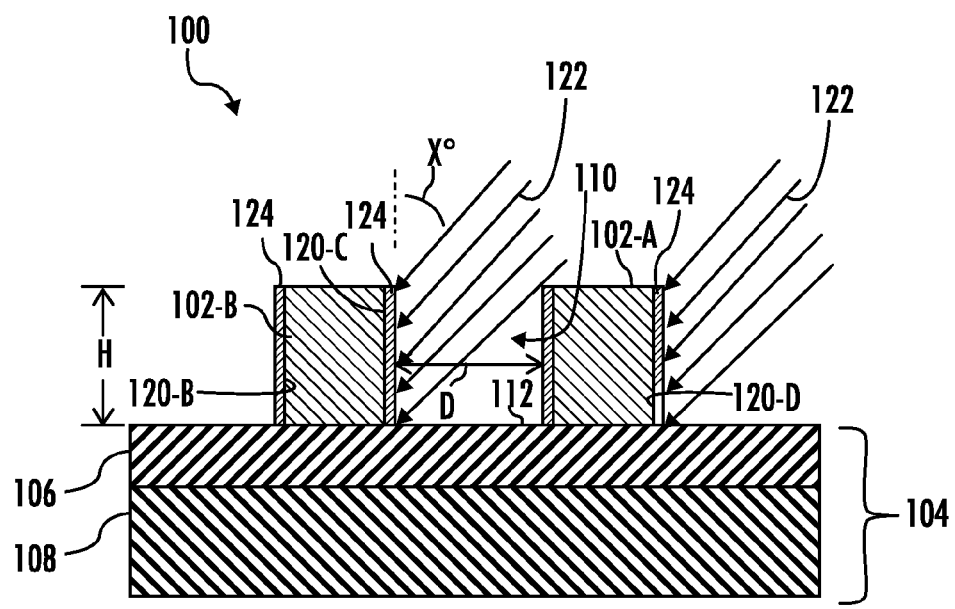
FIG. 2 depicts a side cross-sectional view of an approach for performing another ion implant to the set of patterning features of the semiconductor device of FIG. 1 in accordance with an embodiment of the present disclosure.

During operation, the ion implantation 118 may be performed while the device 100 is in a first position, for example as shown in FIG. 1. Following formation of the treated layer 124 along the sidewall surfaces 120A-B, the device 100 is rotated (e.g., by 30, 45, 60, or 90 degrees), and another ion implantation 122 may be applied to the device 100 to form the treated layer 124 along one or more additional sidewall surfaces 120C-D of the set of patterning features 102A-B, as shown in FIG. 2. In exemplary embodiments, the treated layer 124 is again formed just along the sidewall surfaces 120C-D of the set of patterned features 102A-B. The ion implantation 122 may be performed at an implant angle 'X°' nonparallel with the sidewall surfaces 120C-D, for example, 30 degrees. In one embodiment, the ion implantation 122 imparts ions at approximately 30° incidence angle to the sidewall surfaces 120A-B (or approximately 60° relative to a plane normal to the sidewall surface 120) to form the treated layer 124 along an entire height of each of the sidewall surfaces 120A-B. The implantation angle may vary in other embodiments by +/−15°.

Figure 3:
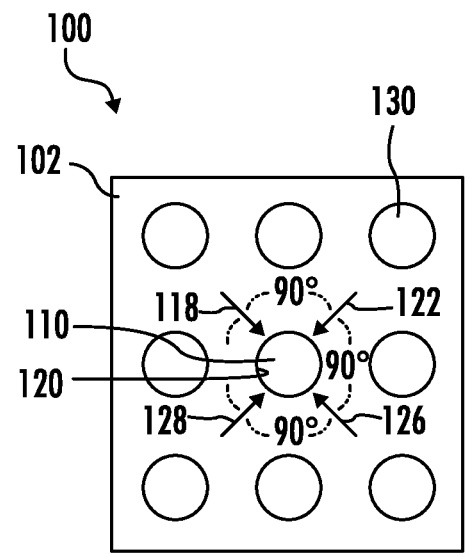
FIG. 3 depicts a top view of a set of contact openings of the semiconductor device of FIG. 1 in accordance with an embodiment of the present disclosure.

In exemplary embodiments, to ensure the set of contact openings 110 remain generally circular during patterning, ion implantation into the device 100 may be carried out using four (4) or more rotations per implant cycle, wherein the semiconductor device is rotated approximately by 30°, 45°, 60°, or 90° depending on the patterns of the contact holes, following each of the four or more ion implants. For example, as shown in FIG. 3, the ion implantation 118 to the set of contact openings 110 when the device 100 is in a first rotational position, the ion implantation 122 to the set of contact openings 110 is performed when the device is in a second rotational position, a third ion implantation 126 is performed to the set of contact openings 110 when the device 100 is in a third rotational position, and a fourth ion implantation 128 is performed to the set of contact openings 110 when the device 100 is in a fourth rotational position. One will appreciate, other embodiments may employ more than four rotational positions.

In the case of significant CER, an extra implant may be included using a light species such as H and He to induce polymer chain scissions and soften the bulk resist, thus making the bulk resist easier to reflow and reduce CER. This extra implant may also be needed if a particular photoresist is naturally more resistant to reflow. Thus in various embodiments, the ion implantations 118, 122, 126, and 128 may represent a single or multiple exposure process employed to generate the treated layer 124. For example, in a one-exposure process, the set of patterning features 102A-B is processed by a first species penetrating the photoresist features 102A-B to a particular depth or thickness. In a multiple exposure process, the set of patterning features 102 may be processed by a first species in a first exposure at a first angled implant, and may be subsequently processed by a second species during a second angled implant different than the angle of the first implant. The second species may penetrate the photoresist features to a particular depth or thickness different than the first species. In various embodiments, the first species may be provided as first ions implanted to a first implantation depth, or deep implantation depth, and the second species may be provided as second ions implanted to a second implantation depth, or shallow implantation depth, less than the first implantation depth.

Advantageously, for embodiments wherein the first species comprise first ions, the first ions may be implanted at a first implantation depth representing a larger fraction of the height of the photoresist feature. The embodiments are not limited in this context. The term "implantation depth," as used herein, may refer to the range Rp of ions within the photoresist, as known in the art.

In particular embodiments, the ions of the ion implantations 118, 122, 126, and 128 may be selected from low-mass ions such as hydrogen ions, helium ions, carbon ions, boron ions, or nitrogen ions. Furthermore, the ion implantation energy and ion dose of the first ions may be selected to modify all or a portion of the set of patterning features 102A-B, including generating chain scission within the photoresist feature, generating cross-linking in the photoresist feature, removing hydrogen atoms from the photoresist feature, altering the density of the photoresist feature, or other chemical and/or physical effects.

In particular embodiments, the ions provided in a second exposure may have a higher mass than the first ions. Exemplary second ions include inert gas ions, such as argon; silicon ions, or silicon-containing ions; and carbon. Other examples of second ions include krypton ions, xenon ions, or germanium ions. The embodiments are not limited in this context. For example, in one embodiment, carbon, silicon, or argon may be used as first ions implanted at an energy in the range of 1-5 keV, e.g., high enough to harden the patterning features 102A-B yet low enough to avoid excessive sputtering.

In other embodiments, the ion implantations 118, 122, 126, and 128 may comprise vacuum ultraviolet (VUV) radiation where the VUV radiation wavelength is less than 200 nm. The VUV radiation may penetrate to a depth representing a large fraction of the set of patterning features 102A-B. In other embodiments the ions of the ion implantations may constitute electrons generated, for example, by a plasma also used as a source for ion implantation.

Advantageously, the ion implantations 118, 122, 126, and 128 may homogenize the treated layer 124 of the set of patterned features 102 and other underlying layer(s) to eliminate or reduce a chemical and mechanical gradient affecting the resist profile and etching properties. The ion implantations may also minimize differences in mechanical properties in different portions of the set of patterned features 102A-B to form the treated layer 124 for example, by generating a density gradient between the bulk, or interior portion, and the shell, or outer portion, of the set of patterned features 102A-B. In other embodiments, the treated layer 124 may include a highly densified shell surrounding the inner portion of the set of patterned features 102A-B. In addition, the ion implantations 118, 122, 126, and 128 may facilitate polymer reorganization and reflow of the set of patterned features 102A-B, and reduction in CER.

Dose of the ion implantations 118, 122, 126, and 128 is another factor dictating the extent of the intended effect. In one embodiment, in the case of the beamline ion implanter, the total dose of the implantation is divided into an even number of increments with the dose per increment in the order of ~$10^{14}$ to prevent resist from deforming due to stress differences between the two sides of the same resist feature. In various embodiments, the ion implantation 118 may comprise relatively lighter ions such as hydrogen or helium ions wherein an ion dose is provided over the range of 1E14-5E15 and at an ion implantation energy of 1 keV-20 keV. In other embodiments, the ion implantation may comprise relatively heavier ions such as argon ions or silicon ions, wherein an ion dose is provided over a range of 1E15-3E16 and an ion implantation energy of 0.2 keV-3 keV.

Additionally, the ion type in ion implantations 118, 122, 126, and 128 further dictates the extent of the intended effect. In various embodiments, the ions may come from a wide range of species such as H, He, Ar, C, N, Si, and Ge. The criteria for selecting one or more ion species to use may include the intended level of sputtering, the target ion penetration depth, and the improvement to etch selectivity. In one embodiment, $Ar^+$ ions are implanted at an ion implantation energy of 250 eV.

Figure 4:
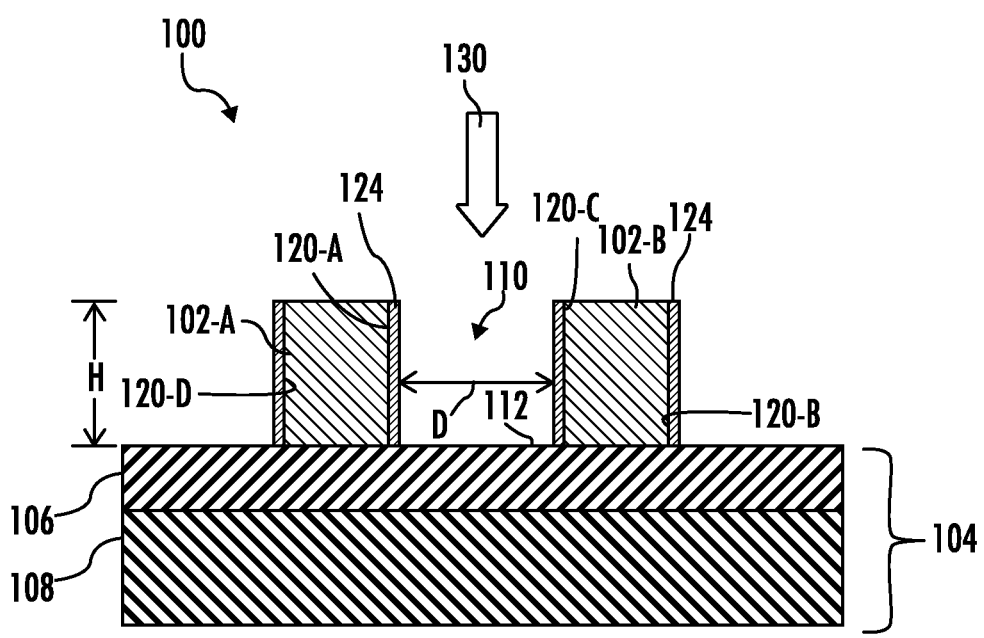
FIG. 4 depicts a side cross-sectional view of an approach for performing an etch to the semiconductor device of FIG. 1 in accordance with an embodiment of the present disclosure.
Figure 5:
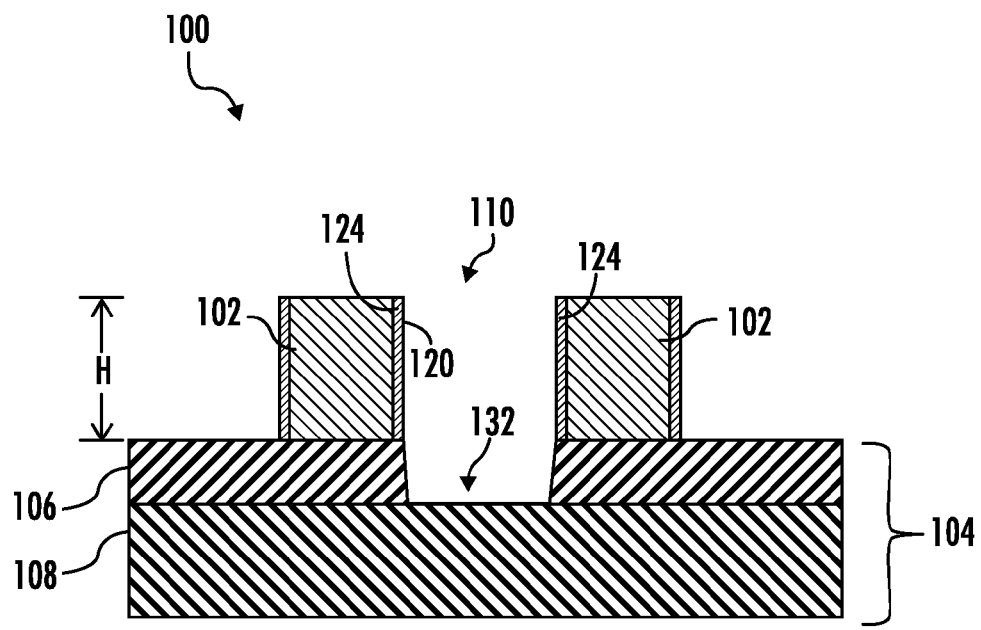
FIG. 5 depicts a side cross-sectional view of an approach for forming a recess in the semiconductor device of FIG. 1 in accordance with an embodiment of the present disclosure.

Referring now to FIG. 4, the device 100 is then etched using an etch process 130, for example a plasma etch, resulting in the structure of the device 100 shown in FIG. 5. In exemplary embodiments, the etch process 130 to the set of contact openings 110 between the set of patterning features 102A-B forms a recess 132 in the substrate 104, e.g., through the layer 106 selective to the second layer 108. As noted above, the layer 106 may correspond to an ARC (e.g., SiARC) and the second layer 108 to a SOC.

Figure 6A:
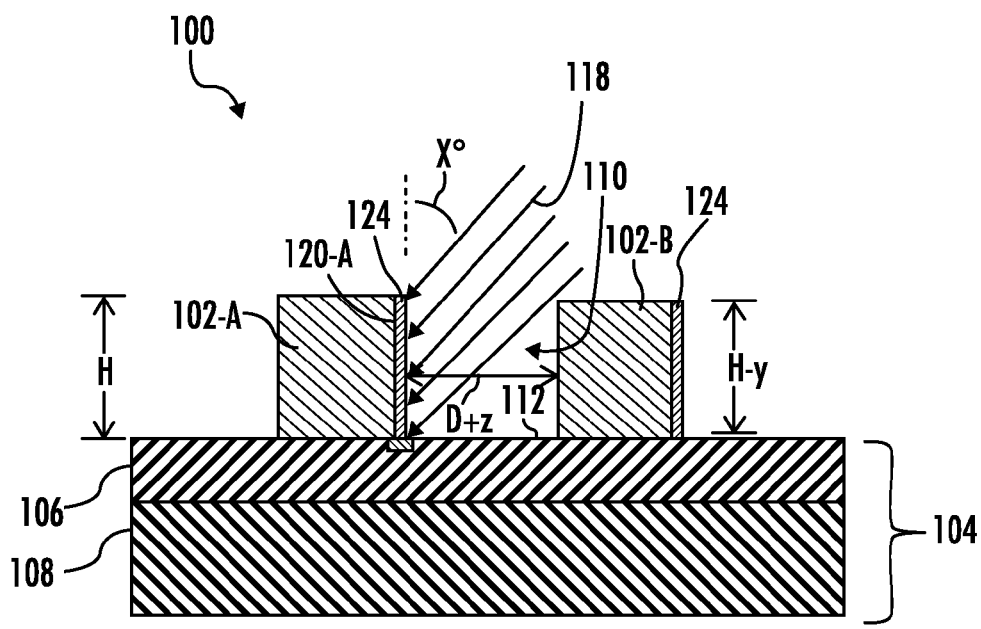
FIGS. 6A-6B depict side cross-sectional views of an approach for varying an ion implant angle for the semiconductor device of FIG. 1 in accordance with an embodiment of the present disclosure.
Figure 6B:
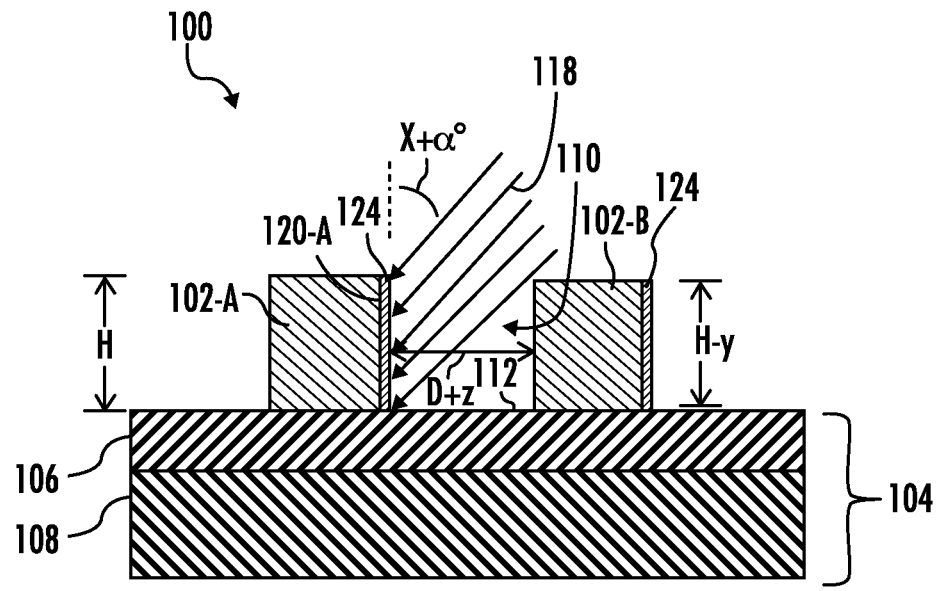

Referring now to FIGS. 6A-6B, an approach for varying the implant angle over the course of a series of ion implants will be described in greater detail. Although the set of patterning features 102A-B may initially have a uniform height 'H' across the wafer and a uniform distance 'D' between adjacent patterning features, due to ion sputtering effect, there may be photoresist loss to some extent in vertical and lateral directions, thus altering the aspect ratio of one or more of the set of contact openings 110. Depending on the extent of such a change, the ion implant angle may be adjusted in increments during the ion implantation to counter this variation and maximize the benefits.

For example, as shown in FIG. 6A, ion sputtering may cause the vertical height 'H' of patterning feature 102-B to be reduced by an amount 'y', and the distance 'D' between the patterning features 102A-B to be increased by an amount 'z'. As a result, the ion implantation 118 is able to penetrate the surface 112 between the set of patterning features 102A-B and begin treating the layer 106. If not corrected, a ring of hardened material may form at a base of the contact opening 110 along the surface 112, resulting in slightly smaller recesses in the substrate 104 after a subsequent etch process and thus reducing the effective contact hole CD.

Accordingly, embodiments herein provide for adjustment of the implant angle between one or more of a plurality of ion implants. For example, as shown in FIG. 6B, the ion implant angle 'X' is adjusted by an amount 'α' to compensate for the photoresist loss to the set of patterning features 102A-B. As shown, the adjusted ion implant angle X+α prevents the ion implant 118 from hitting the surface 112 of the layer 106 between the set of patterning features 102A-B. The treated layer 124 is once again formed just along the sidewall surfaces of the set of patterning features 102A-B. In one embodiment, a metrology tool (not shown) may be used to measure dimensional change to the set of patterning features 102A-B during device processing, and communicate the changes to an ion implant device for corresponding adjustment of the ion implant angle.

In various embodiments, the angled ion implantations described herein may be provided to the set of patterning features 102A-B in a plasma doping tool (PLAD), a plasma tool having a plasma sheath modifier as known in the art, or other tool capable of providing ions. The embodiments of the disclosure are not limited in this context.

Figure 7:
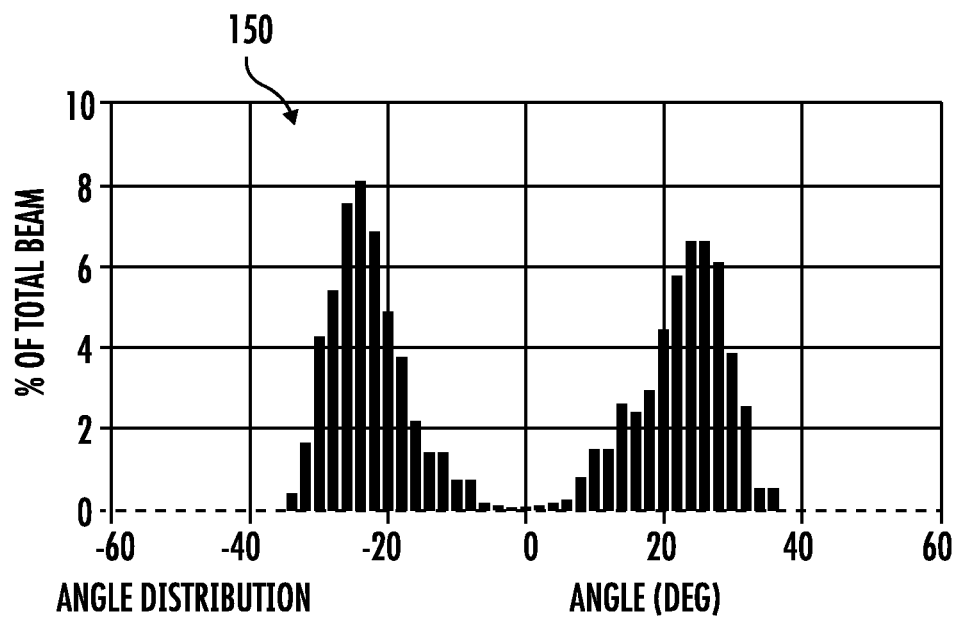
FIG. 7 represents a chart illustrating ion angular distribution from a bimodal ion assisted deposition and doping (IADD) beam in accordance with an embodiment of the present disclosure.

In one embodiment, the angled ion implantations described herein may be provided to the set of patterning features 102A-B in a beamline tool due to the strict restrictions on ion angles. In other embodiments, an implant apparatus using a bimodal sheath can produce diverging, large angle ion beams with no or little ions in the center. FIG. 7 shows an example of such a beam angle distribution 150. In this particular example, the majority of the ions are around ±25 degrees. This angle can be controlled by changing source parameters such as energy, duty cycle, and extraction voltage, and by using different bimodal hardware. In some embodiments, angled ion implants according to embodiments herein may be implemented on an Ion Assisted Deposition and Doping (IADD) platform.

Figure 8:
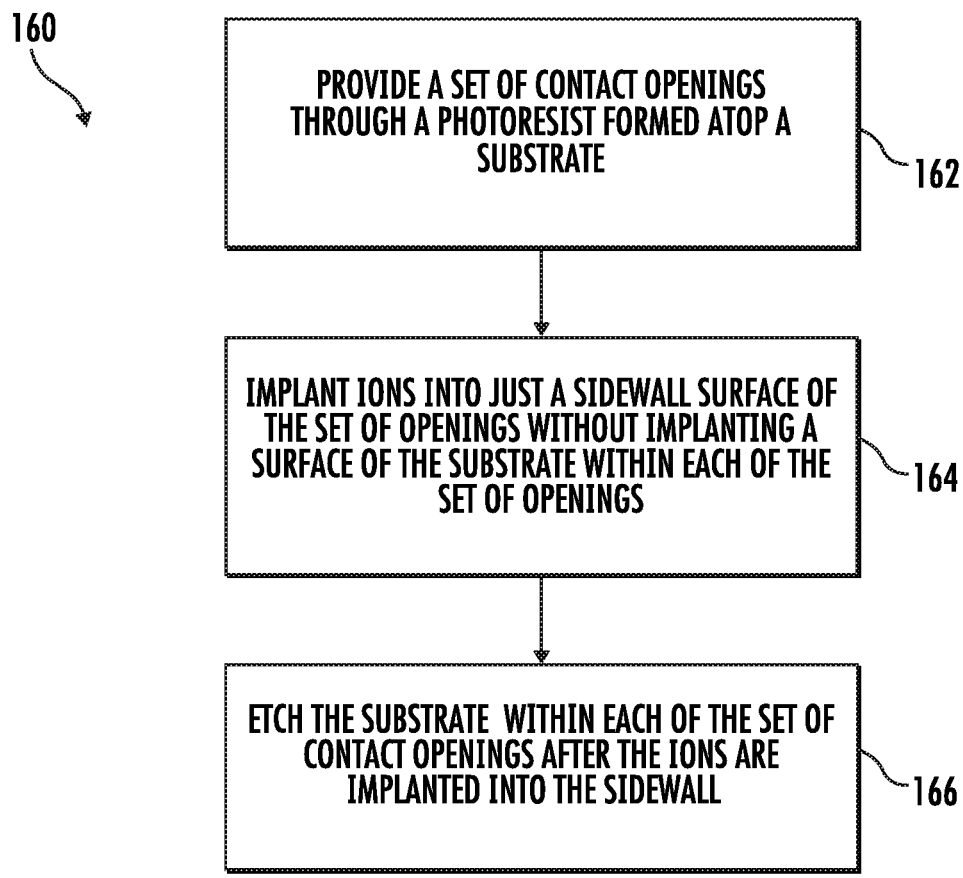
FIG. 8 is a flowchart illustrating an exemplary method according to the present disclosure.

Referring now to FIG. 8, a flow diagram illustrating an exemplary method 160 for patterning a semiconductor device in accordance with the present disclosure is shown. The method 160 will be described in conjunction with the representations shown in FIGS. 1-7.

Method 160 may include providing a set of contact openings through a photoresist formed atop a substrate, as shown in block 162. In some embodiments, the photoresist may include a set of patterning features having a uniform height. In some embodiments, the substrate includes an anti-reflective coating formed atop a spin-on carbon.

The method 160 may further include implanting ions into just a sidewall surface of the set of contact openings, as shown in block 164. In some embodiments, the ions are implanted at an angle nonparallel with the sidewall surface. In some embodiments, the ions are implanted at an angle nonparallel with the sidewall surface, for example, 30 degrees relative to the sidewall surface. In some embodiments, the ions may be implanted into the sidewall surface of the set of patterning features at an angle relative to the sidewall surface selected to prevent ions from implanting the bottom of the contact openings. In some embodiments, the ions are implanted along an entire height of the sidewall surface. In some embodiments, the semiconductor device is rotated to a plurality of positions, and an ion implant is performed to the sidewall surface at each of the plurality of positions. In some embodiments, a plurality of ion implants are performed, wherein the implant angle is varied between one or more of the plurality of ion implants. In some embodiments, a treatment layer is formed along the sidewall surface of each of the set of openings.

The method 160 may further include etching the semiconductor device after the ions are implanted into the sidewall surface, as shown in block 166. In some embodiments, the method may include etching the layer between the set of patterning features. In some embodiments, the method includes etching the substrate within the set of contact openings to form a recess through the ARC selective to the SOC.

In view of the foregoing, at least the following advantages are achieved by the embodiments disclosed herein. Firstly, angling an ion implant directed to just a sidewall surface of a patterning feature reduces CER, in turn leading to LCDU improvement. Secondly, excessive footing material is removed at the bottom of the contact openings. Thirdly, the angled ion implant causes polymer fragmentation and densification within the photoresist, facilitating resist reflow and improving CER. Fourthly, the angled ion implant alters the etch resistance of the photoresist and the substrate (e.g., SiARC) by densifying and hardening the polymers. Fifthly, the effects on the photoresist features from the angled ion implants are aspect-ratio dependent and thus correct the contact hole non-uniformity, resulting in improved LCDU.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

The invention claimed is:

1. A method for forming a semiconductor device, the method comprising:
   providing a set of contact openings through a photoresist formed atop a substrate;
   implanting ions into just a sidewall surface of the set of contact openings to form a treated layer along the sidewall surface, wherein the ions are implanted at an implant angle nonparallel with the sidewall surface to implant ions along an entire height of the sidewall surface and to prevent the ions from implanting a surface of the substrate within the set of contact openings; and
   etching the substrate within the set of contact openings after the ions are implanted into the sidewall surface and while the treated layer is present along the sidewall surface.

2. The method according to claim 1, further comprising:
   rotating the semiconductor device to a plurality of positions; and
   performing an ion implant to the sidewall surface at the plurality of positions.

3. The method according to claim 1, further comprising performing a plurality of ion implants, wherein the implant angle is varied between one or more of the plurality of ion implants.

4. The method according to claim 1, wherein the photoresist defines a set of patterning features having a uniform height.

5. The method according to claim 1, wherein the substrate is an anti-reflective coating (ARC) formed atop a spin-on carbon (SOC).

6. The method according to claim 5, further comprising etching the substrate within the set of contact openings to form a recess through the ARC selective to the SOC.

7. A method for forming a semiconductor device, the method comprising:
   providing a set of contact openings through a photoresist formed atop a substrate;
   implanting ions into just a sidewall surface defined by the set of contact openings, wherein the ions are implanted at an implant angle nonparallel with the sidewall surface selected to prevent the ions from implanting a surface of the substrate within the set of contact openings and to form a treated layer along an entire height of the sidewall surface; and
   etching the surface of the substrate within the set of contact openings after the ions are implanted into the sidewall surface and while the treated layer is present along the sidewall surface.

8. The method according to claim 7, further comprising etching the surface of the substrate within the set of contact openings to form a recess within the substrate.

9. The method according to claim 8, wherein the substrate is a silicon anti-reflective coating (SiARC) formed atop a spin-on carbon (SOC).

10. The method according to claim 9, further comprising etching the substrate within the set of contact openings to form an opening through the SiARC selective to the SOC.

11. The method according to claim 7, further comprising:
rotating the semiconductor device to a plurality of positions; and
implanting ions into the sidewall surface at the plurality of positions.

12. The method according to claim 7, further comprising performing a plurality of ion implants, wherein the implant angle is varied between one or more of the plurality of ion implants.

13. The method according to claim 7, wherein the photoresist defines a set of patterning features having a uniform height.

14. A method for patterning a semiconductor device, the method comprising:
providing a set of photoresist patterning features atop a substrate, the set of patterning features defining a set of contact openings formed through a photoresist;
performing a series of ion implants to a sidewall surface of the set of photoresist patterning features, wherein ions are implanted at an implant angle nonparallel with the sidewall surface to prevent the ions from implanting a surface of the substrate between the set of patterning features and to form a treated layer along an entire height of the sidewall surface; and
etching, while the treated layer is present along the sidewall surface, the substrate to recess the set of contact openings into a first layer of the substrate.

15. The method according to claim 14, further comprising performing at least four (4) ion implants to the sidewall surface, wherein the semiconductor device is rotated by at least 30° in between the at least four ion implants.

16. The method according to claim 14, further comprising adjusting the implant angle during the series of ion implants.

17. The method according to claim 16, further comprising measuring a change in a dimension of the set of patterning features, wherein the implant angle is adjusted in response to the change in the dimension of the set of patterning features.

18. The method according to claim 14, wherein the set of patterning features initially has a uniform height.

\* \* \* \* \*